United States Patent
Levy et al.

(10) Patent No.: US 9,484,301 B2
(45) Date of Patent: Nov. 1, 2016

(54) CONTROLLED METAL EXTRUSION OPENING IN SEMICONDUCTOR STRUCTURE AND METHOD OF FORMING

(71) Applicant: GLOBALFOUNDRIES INC., Grand Cayman (KY)

(72) Inventors: Max G. Levy, Essex Junction, VT (US); Gary L. Milo, Milton, VT (US); Matthew D. Moon, Jeffersonville, VT (US); Anthony C. Speranza, Georgetown, TX (US); Timothy D. Sullivan, Underhill, VT (US); David C. Thomas, Richmond, VT (US); Steven S. Williams, Essex Junction, VT (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 14/718,466

(22) Filed: May 21, 2015

(65) Prior Publication Data

US 2015/0255395 A1    Sep. 10, 2015

Related U.S. Application Data

(62) Division of application No. 13/783,943, filed on Mar. 4, 2013, now Pat. No. 9,059,258.

(51) Int. Cl.
*H01L 23/528* (2006.01)
*H01L 21/768* (2006.01)
(Continued)

(52) U.S. Cl.
CPC ..... *H01L 23/5283* (2013.01); *H01L 21/76883* (2013.01); *H01L 23/528* (2013.01); *H01L 23/5223* (2013.01); *H01L 23/53214* (2013.01); *H01L 23/53223* (2013.01); *H01L 28/60* (2013.01); *H01L 2924/0002* (2013.01)

(58) Field of Classification Search
CPC ............... H01L 23/5283; H01L 23/53214
See application file for complete search history.

(56) References Cited

U.S. PATENT DOCUMENTS

| 7,078,817 B2 | 7/2006 | Ho et al. |
| 7,087,516 B2 | 8/2006 | Hau-Riege |

(Continued)

OTHER PUBLICATIONS

Office Action Communication for U.S. Appl. No. 13/783,943, dated Dec. 31, 2014, 12 pages.

(Continued)

*Primary Examiner* — Joseph C Nicely
(74) *Attorney, Agent, or Firm* — David Cain; Hoffman Warnick LLC

(57) ABSTRACT

Aspects of the present invention relate to a controlled metal extrusion opening in a semiconductor structure. Various embodiments include a semiconductor structure. The structure includes an aluminum layer. The aluminum layer includes an aluminum island within the aluminum layer, and a lateral extrusion receiving opening extending through the aluminum layer adjacent the aluminum island. The opening includes a lateral extrusion of the aluminum layer of the semiconductor structure. Additional embodiments include a method of forming a semiconductor structure. The method can include forming an aluminum layer over a titanium layer. The aluminum layer includes an aluminum island within the aluminum layer. The method can also include forming an opening extending through the aluminum layer adjacent the aluminum island within the aluminum layer. The opening includes a lateral extrusion of the aluminum layer of the semiconductor layer.

2 Claims, 16 Drawing Sheets

(51) Int. Cl.
  *H01L 49/02* (2006.01)
  *H01L 23/522* (2006.01)
  *H01L 23/532* (2006.01)

(56) References Cited

U.S. PATENT DOCUMENTS

| | | | |
|---|---|---|---|
| 7,122,898 B1 * | 10/2006 | Yang | H01L 23/5228 257/751 |
| 7,671,444 B2 | 3/2010 | Wang et al. | |
| 7,772,702 B2 | 8/2010 | Bielefeld et al. | |
| 8,227,923 B2 | 7/2012 | Wang | |
| 8,232,646 B2 | 7/2012 | Bonilla et al. | |
| 8,237,283 B2 | 8/2012 | Chandra et al. | |
| 2006/0057835 A1 | 3/2006 | Anderson et al. | |
| 2009/0014884 A1 * | 1/2009 | Li | H01L 23/528 257/767 |
| 2015/0035117 A1 * | 2/2015 | Adderly | H01L 28/40 257/532 |

OTHER PUBLICATIONS

Notice of Allowance and Fee(s) Due for U.S. Appl. No. 13/783,943, dated Apr. 20, 2015, 9 pages.

Restriction Requirement for U.S. Appl. No. 13/783,943, dated Jul. 15, 2014, 9 pages.

* cited by examiner

CONTROLLED METAL EXTRUSION OPENING IN SEMICONDUCTOR STRUCTURE AND METHOD OF FORMING

CROSS-REFERENCE TO RELATED APPLICATION

This application claims priority to U.S. patent application Ser. No. 13/783,943, which received a Notice of Allowance on Apr. 20, 2015, and is hereby incorporated by reference in its entirety.

BACKGROUND

1. Technical Field

The subject matter disclosed herein is related generally to semiconductor structures. More particularly, the subject matter disclosed herein relates to a controlled metal extrusion opening in a semiconductor structure and method of forming.

2. Related Art

The layers of material forming a semiconductor structure undergo a variety of physical changes during the formation of the semiconductor structure. For example, during a metal annealing process, the metal layers of the semiconductor structure may be exposed to high temperatures for an extended period of time, and may also experience a compression force from the layers of the semiconductor positioned above the metal layers. Due to the high temperature and/or compression force, some of the metal layers of the semiconductor structure may form extrusions during the metal annealing process. These extrusions may form on the sidewalls of the semiconductor structure, and may result in shorting of an active circuit area within the semiconductor structure.

Conventional semiconductor structures may include a slot or void in a metal layer surrounding the active circuit area to compensate for anticipated extrusions formed during the metal annealing process. However, dependent on the exposure to the high temperature during the metal annealing process, the metal layer may still form extrusions that short the active circuit area. That is, the slots or voids may not prevent shorting in the circuit, especially in the semiconductor structure which includes a small island circuit. The extrusions may be controlled by making the slots or voids larger. However, by making the slots or voids larger, the size of the active circuit becomes larger, which results in a larger semiconductor structure. Electronic devices utilizing a larger semiconductor structure may require new design of the circuitry and/or may require a larger overall size, which is undesirable.

BRIEF SUMMARY

A controlled metal extrusion opening in a semiconductor structure and methods of forming are disclosed. Various embodiments include a semiconductor structure. The semiconductor structure including: an aluminum layer including: an aluminum island within the aluminum layer; and a lateral extrusion receiving opening extending through the aluminum layer adjacent the aluminum island within the aluminum layer, the opening including a lateral extrusion of the aluminum layer of the semiconductor structure.

A first aspect of the invention includes a semiconductor structure having: an aluminum layer including: an aluminum island within the aluminum layer; and a lateral extrusion receiving opening extending through the aluminum layer adjacent the aluminum island within the aluminum layer, the opening including a lateral extrusion of the aluminum layer of the semiconductor structure.

A second aspect of the invention includes a method of forming a semiconductor structure. The method includes: forming an aluminum layer over a titanium layer, the aluminum layer including an aluminum island within the aluminum layer; and forming an opening extending through the aluminum layer adjacent the aluminum island within the aluminum layer, the opening including a lateral extrusion of the aluminum layer of the semiconductor layer.

A third aspect of the invention includes a semiconductor structure having: an aluminum layer including: an aluminum island within the aluminum layer for creating an active circuit area of the semiconductor structure; and an opening extending through the aluminum layer in a non-active circuit area of the semiconductor structure adjacent the aluminum island, the opening including a lateral extrusion of the aluminum layer of the semiconductor structure.

BRIEF DESCRIPTION OF THE DRAWINGS

These and other features of this invention will be more readily understood from the following detailed description of the various aspects of the invention taken in conjunction with the accompanying drawings that depict various embodiments of the invention, in which.

Figure 1:
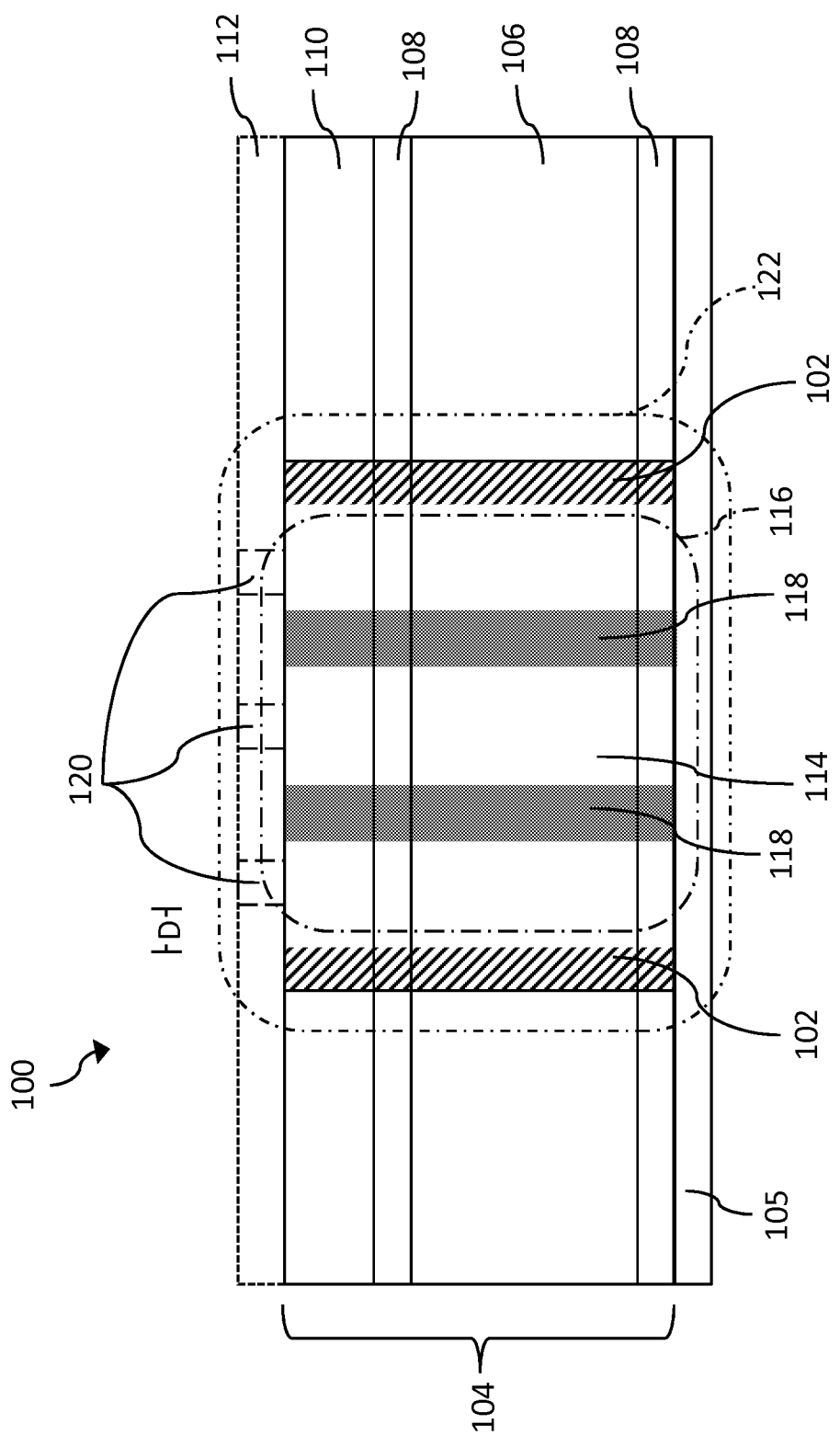
FIG. 1 shows a cross-sectional view of a portion of a semiconductor structure including lateral extrusion receiving openings prior to a metal annealing process, according to various embodiments of the invention.

It is noted that the drawings of the invention are not necessarily to scale. The drawings are intended to depict only typical aspects of the invention, and therefore should not be considered as limiting the scope of the invention. In the drawings, like numbering represents like elements between the drawings.

DETAILED DESCRIPTION

As described herein, aspects of the invention relate to a controlled metal extrusion opening in a semiconductor structure and method of forming. Specifically, as described herein, aspects of the invention related to a semiconductor structure including a plurality of openings for receiving a lateral extrusion of the aluminum layer during a metal annealing process of the semiconductor structure.

Turning to FIG. 1 a cross-sectional view of a portion of a semiconductor structure 100 is shown including lateral extrusion receiving openings 102 prior to a metal annealing process according to various embodiments of the invention. As shown in FIG. 1, and as discussed herein, semiconductor structure 100 may include a metal-insulator-metal (MIM) capacitor (not shown) and specifically, the portion of semiconductor structure 100 may include a metallurgy stack 104 which may act as a bottom plate for a MIM capacitor.

As shown in FIG. 1, metallurgy stack 104 of semiconductor structure 100 may be formed over an oxide layer 105, and may include an aluminum (Al) layer 106 positioned between two titanium (Ti) layers 108. In an embodiment, as shown in FIG. 1, metallurgy stack 104 may also include a titanium nitride (TiN) layer 110 positioned above the aluminum layer 106. More specifically, as shown in FIG. 1, titanium nitride layer 110 may be disposed over titanium layer 108 formed over aluminum layer 106. Titanium nitride layer 110 may form the top layer of metallurgy stack 104 of semiconductor structure 100. More specifically, where semiconductor structure 100 includes a MIM capacitor, a silicon nitride (Si3N4) layer 112 (shown in phantom) of the MIM capacitor may be disposed over titanium nitride layer 110 of metallurgy stack 104. Silicon nitride layer 112 may act as an insulator layer for the MIM capacitor of semiconductor structure 100.

Although discussed herein as metallurgy stack 104 being for a MIM capacitor, it is understood that semiconductor structure 100 may include a variety of integrated circuit devices that may utilize opening 102 in a layer to substantially prevent lateral extrusions (e.g., FIGS. 3 and 4) during a metal annealing process. More specifically, it is understood that semiconductor structure 100 may be any integrated circuit device that may include a variety of material making up the layers (e.g., aluminum layer 106, titanium layer 108) of semiconductor structure 100, that may undergo a metal annealing process, and as a result my include lateral extrusions. As such, openings 102 are not limited to metallurgy stack 104 for a MIM capacitor, rather openings 102 may be included in any metal layer of an integrated circuit device that may include lateral extrusions (FIGS. 3 and 4) formed during a metal annealing process of the integrated circuit device.

Figure 2:
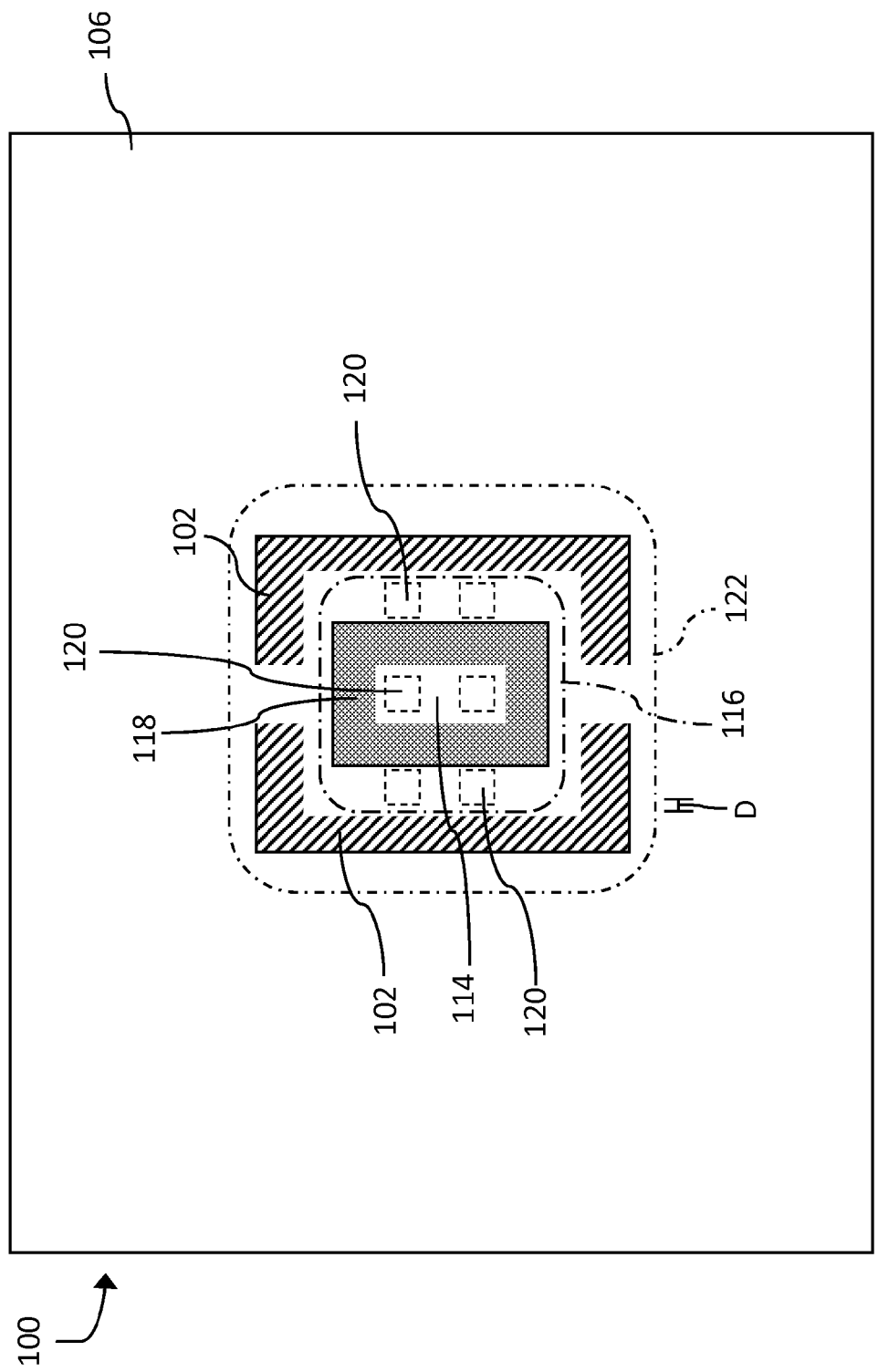
FIG. 2 shows a top plan view of an aluminum layer of a semiconductor structure including a lateral extrusion receiving opening prior to a metal annealing process, according to various embodiments of the invention.

As shown in FIGS. 1 and 2, aluminum layer 106 may include an aluminum island 114 within aluminum layer 106. More specifically, as shown in FIGS. 1 and 2, aluminum layer 106 may include an isolated portion or aluminum island 114 formed within aluminum layer 106, such that aluminum island 114 may be a piece of aluminum layer 106 substantially discontinuous from the rest of aluminum layer 106. Aluminum island 114 within aluminum layer 106 may be substantially discontinuous from aluminum layer 106 for creating an active circuit area 116 of semiconductor structure 100. Active circuit area 116 of semiconductor structure 100 may electrically connect the various layers (e.g., aluminum layer 106, titanium layer 108) of semiconductor structure 100, as discussed herein. Aluminum island 114 within aluminum layer 106 of semiconductor structure 100 may be formed by removing material from metallurgy stack 104. More specifically, aluminum island 114 within aluminum layer 106 of semiconductor structure 100 may be formed by removing material from metallurgy stack 104, through aluminum layer 106 and the surrounding layers (e.g., titanium layer 108, titanium nitride layer 110) to form a substantially ring-shaped opening 118 extending through metallurgy stack 104. Substantially ring-shaped opening 118 may be formed within metallurgy stack to substantially surround aluminum island 114 within aluminum layer 106. That is, as shown in FIG. 2, the formation of substantially ring-shaped opening 118 may simultaneously form aluminum island 114 within aluminum layer 106.

Semiconductor structure 100, as shown in FIGS. 1 and 2, may also include a plurality of vias 120. More specifically, as shown in FIG. 1 silicon nitride layer 112 may include a plurality of vias 120 positioned adjacent substantially ring-shaped opening 118, and aluminum island 114 of aluminum layer 106. In an embodiment, as shown in FIGS. 1 and 2 (shown in phantom), the plurality of vias 120 formed in silicon nitride layer 112 may be positioned adjacent to and between opening 102 and substantially ring-shaped opening 118 formed in metallurgy stack 104. Additionally, as shown in FIGS. 1 and 2 (shown in phantom), the plurality of vias 120 may be positioned adjacent and above aluminum island 114 of aluminum layer 106, and within substantially ring-shaped opening 118. As shown in FIGS. 1 and 2 (shown in phantom), the plurality of vias 120 may be formed in semiconductor structure 100 within active circuit area 116 to electrically connect the metal layers in semiconductor structure 100. As shown in FIG. 2, the plurality of vias 120 (shown in phantom) are illustrated to show the positioning of the plurality of vias 120 with respect to the various components (e.g., opening 102, aluminum island 114, substantially ring-shaped opening 118, etc.) of semiconductor structure 100.

Also shown in FIGS. 1 and 2, aluminum layer 106 of semiconductor structure 100 may also include lateral extrusion receiving opening (opening) 102 extending through aluminum layer 106 adjacent aluminum island 114 within aluminum layer 106. More specifically, metallurgy stack 104, including aluminum layer 106, may include opening 102 extending through aluminum layer 106 in a non-active circuit area 122 of semiconductor structure 100 adjacent active circuit area 116 including aluminum island 114 within aluminum layer 106. As discussed herein, non-active circuit area 122 may include an area within semiconductor structure 100 that is not critical to the circuits formed in semiconductor structure 100, and as a result may be an area of semiconductor structure 100 which may be shorted or grounded by design. In an embodiment, as shown in FIGS. 1 and 2, opening 102 may also be positioned adjacent substantially ring-shaped opening 118 extending through aluminum layer 106. More specifically, opening 102 may be positioned adjacent substantially ring-shaped opening 118 formed through metallurgy stack 104 and opening 102 may be positioned outside of the plurality of vias 120 formed within silicon nitride layer 112. As shown in FIGS. 1 and 2, opening 102 may extend through aluminum layer 106 a predetermined distance (D) from the plurality of vias 120 (shown in phantom) formed in silicon nitride layer 112 (FIG. 1).

Figure 3:
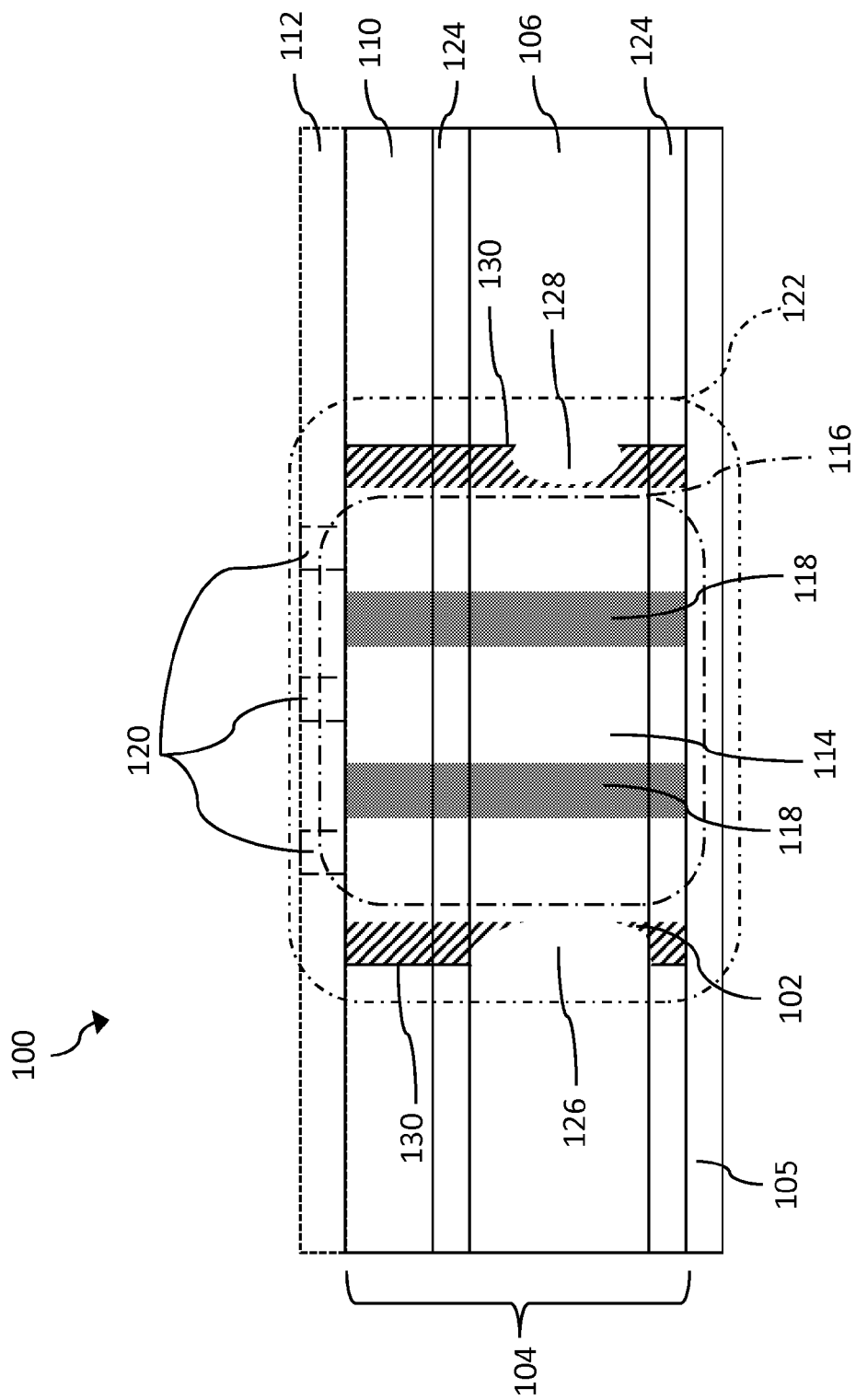
FIG. 3 shows a cross-sectional view of a portion of a semiconductor structure including lateral extrusion receiving opening after a metal annealing process, according to various embodiments of the invention.
Figure 4:
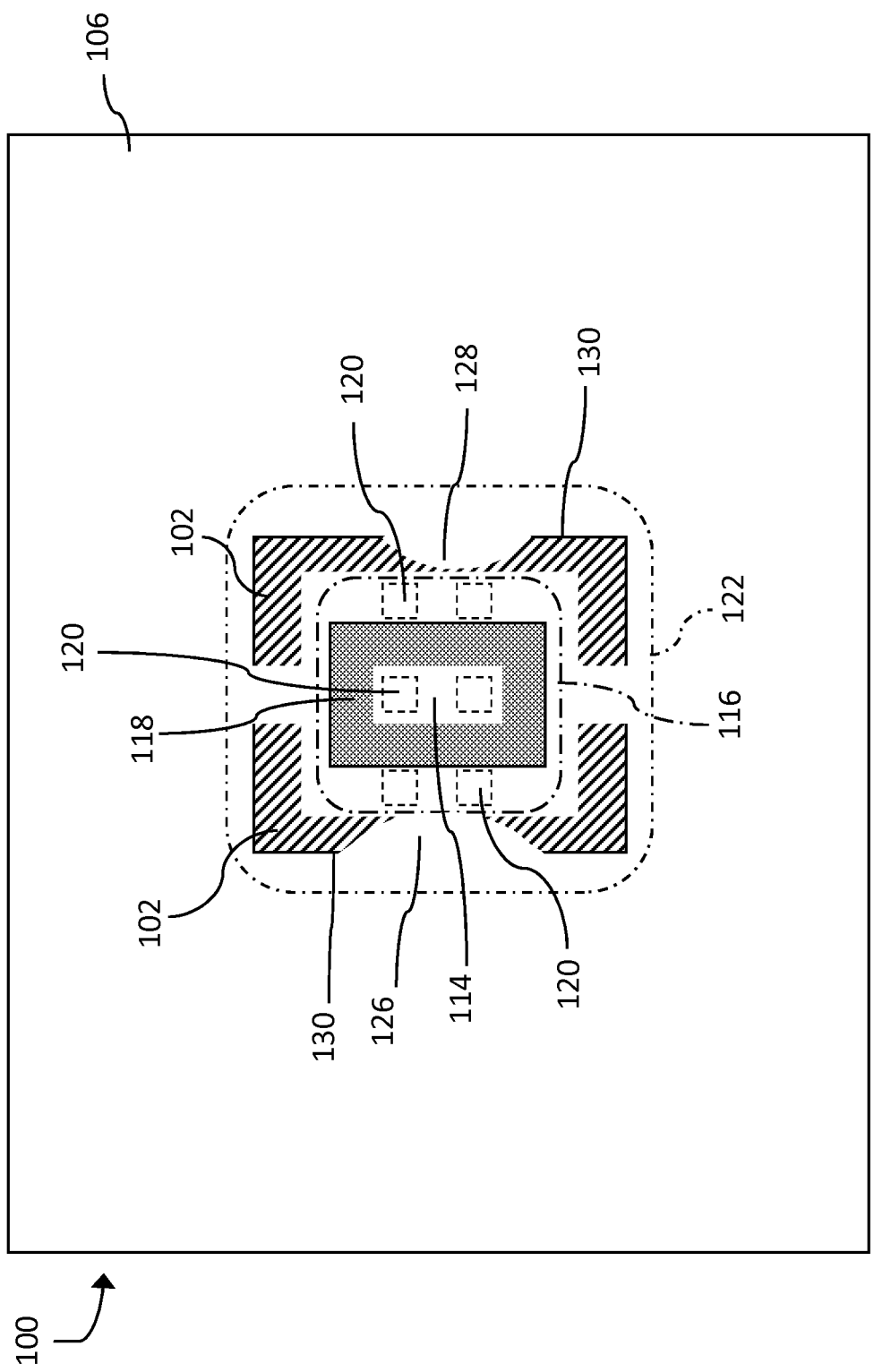
FIG. 4 shows a top plan view of an aluminum layer of a semiconductor structure including a lateral extrusion receiving opening after a metal annealing process, according to various embodiments of the invention.

Turning to FIGS. 3 and 4, semiconductor structure 100 including opening 102 is shown after a metal annealing process, according to embodiments of the invention. As shown in FIG. 3, some of the layers of metallurgy stack 104 may be altered as a result of the metal annealing process. Specifically, as a result of semiconductor structure 100 undergoing a metal annealing process, titanium layers 108 (FIG. 1) may be converted to a titanium aluminide (TiAl3) layer 124 positioned above and below aluminum layer 106. Additionally, as shown in FIG. 3, and in comparison to FIG. 1, aluminum layer 106 may be substantially compressed, resulting in a decrease in height of aluminum layer 106. More specifically, aluminum later 106 may decrease in height after the metal annealing process as a result of lateral extrusions 126, 128 forming in semiconductor structure 100. Lateral extrusions 126, 128 of aluminum layer 106, as shown in FIGS. 3 and 4, may be formed in aluminum layer 106 as a result of the high temperature and/or compression force applied to semiconductor structure 100 during the metal annealing process.

As shown in FIGS. 3 and 4, opening 102 may include lateral extrusions 126, 128 of aluminum layer 106 of semiconductor 100. More specifically, opening 102 may provide a space for receiving lateral extrusions 126, 128 of aluminum layer 106 that may be formed in semiconductor structure 100 during the metal annealing process. By forming opening 102 in aluminum layer 106 of semiconductor structure 100, lateral extrusions 126, 128 formed during the metal annealing process may be formed in opening 102, instead of being formed in substantially ring-shaped opening 118. More specifically, during the metal annealing process of semiconductor structure 100 lateral extrusions 126, 128 may be formed in opening 102 in non-active circuit area 122 instead of substantially ring-shaped opening 118 positioned within active circuit area 116. In an embodiment, as shown in FIGS. 3 and 4, lateral extrusion 126 may be included within opening 102, and may extend from an endwall 130 of opening 102. That is, lateral extrusion 126 may extend the entire width of opening 102, such that lateral extrusion 126 formed adjacent vias 120 may extend through opening 102 from endwall 130 of aluminum layer 106. As shown in FIGS. 3 and 4, lateral extrusion 126 contacting aluminum layer 106, adjacent vias 120, through opening 102 may cause an electrical connectivity issue in semiconductor structure 100. More specifically, by extending from endwall 130 to aluminum layer 106 adjacent vias 120, lateral extrusion 126 may short a potential circuit formed in non-active circuit area 122. However, as discussed herein, non-active circuit area 122 may be designed to be shorted prior to the metal annealing process and/or may be designed such that when a short is created by lateral extrusion 126 of aluminum layer 106, the active circuit area 116 is unaffected.

Also shown in FIGS. 3 and 4, lateral extrusion 128 included within opening 102 may only partially extend into opening 102. That is, lateral extrusion 128, may extend from sidewall 130 of opening 102, however, lateral extrusion 128 may not contact aluminum layer 106 adjacent vias 120. However, as discussed herein, opening 102 may be formed in non-active circuit area 122, which may be shorted by design prior to the metal annealing process, or may not provide an electric circuit for semiconductor structure 100. Although lateral extrusion 128 does not extend the entire width of opening 102, by including or allowing lateral extrusion 128 to form within opening 102 during the metal annealing process, active circuit area 116, and specifically aluminum island 114 within aluminum layer 106, may not be compromised by lateral extrusion 128.

By allowing and/or controlling lateral extrusions 126, 128 to form or extrude into opening 102, active circuit area 116, and specifically aluminum island 114 within aluminum layer 106, may substantially avoid coming in contact with lateral extrusions 126, 128, which may decrease the reliability and/or short the circuit formed in active circuit area 116. That is, opening 102 may provide a space for lateral extrusions 126, 128 to form in an area of semiconductor structure 100 that is safe and/or a distance (D) (FIG. 1) away from active circuit area 116 which electrically connects the various layers of semiconductor structure 100. In controlling lateral extrusions 126, 128 formed in aluminum layer 106 of semiconductor structure 100 during the metal annealing process, the reliability in manufacturing semiconductor structure 100 may be increased. Additionally, by utilizing opening 102 in aluminum layer 106 to include lateral extrusions 126, 128, semiconductor structures 100 may avoid shorts or other insufficient electrical connections within aluminum island 114 of active circuit area 116.

Figure 5:
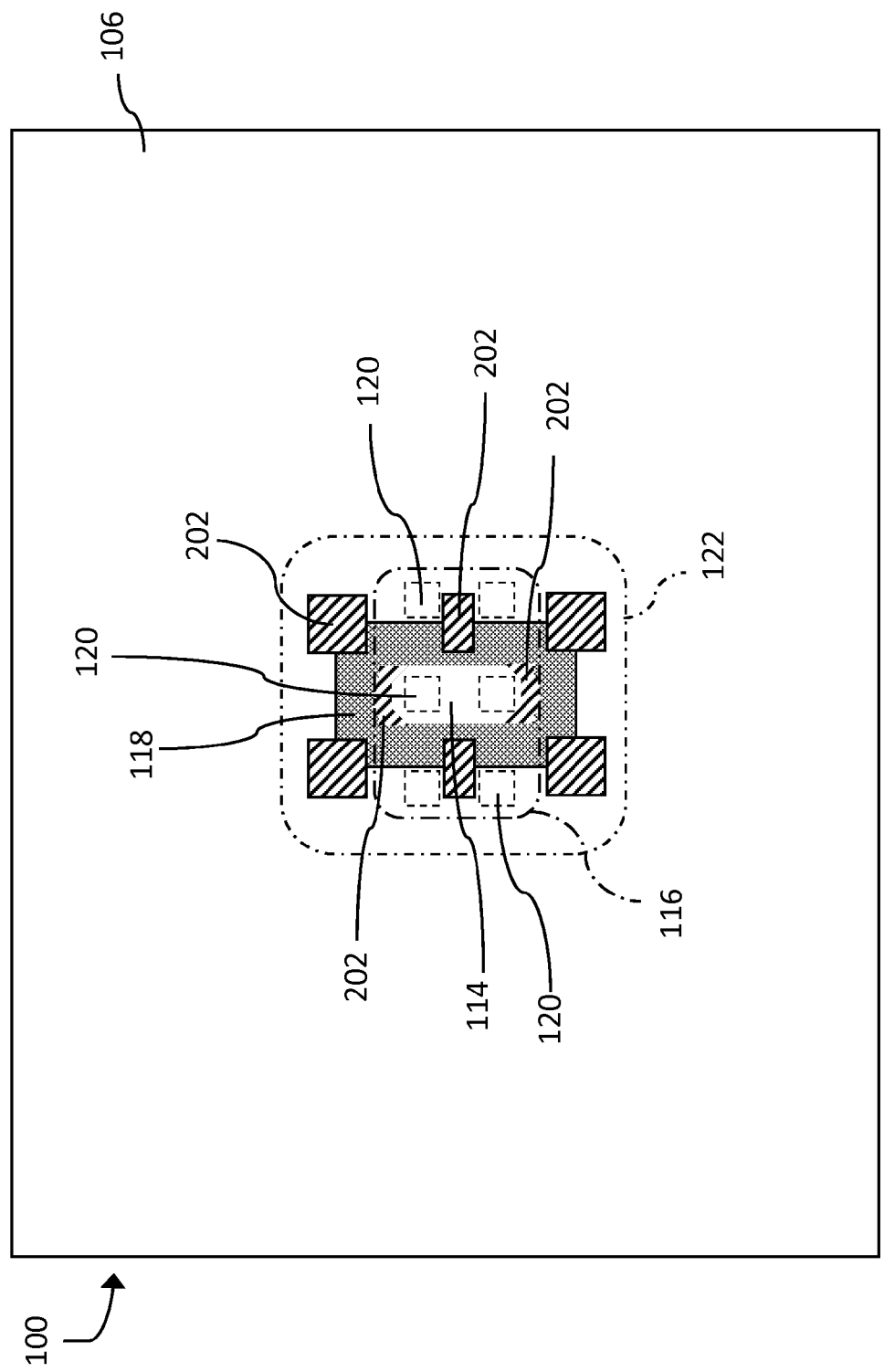
FIGS. 5-12 show top plan views of an aluminum layer of a semiconductor structure including lateral extrusion receiving opening, according to alternative embodiments of the invention.

Turning to FIGS. 5-12, semiconductor structure 100 including opening (e.g., openings 202, 302, 402, 502, 602) is shown according to various alternative embodiments of the invention. As shown in FIG. 5, a portion of opening 202 may extend through aluminum layer 106 within substantially ring-shaped opening 118. More specifically, as shown in FIG. 5, a portion of opening 202 may extend into the space formed by substantially ring-shaped opening 118, such that opening 202 may provide additional space within substantially ring-shaped opening 118 for receiving lateral extrusions 126, 128 (FIGS. 3 and 4), as discussed herein. Also shown in FIG. 5, opening 202 may extend through aluminum layer 106 between aluminum island 114 within aluminum layer 106 and substantially ring-shaped opening 118. More specifically, as shown in FIG. 5, opening 202 may extend through a section of aluminum island 114 within aluminum layer 106 and may also include a portion of opening 102 that may extend into the space formed by substantially ring-shaped opening 118.

Figure 6:
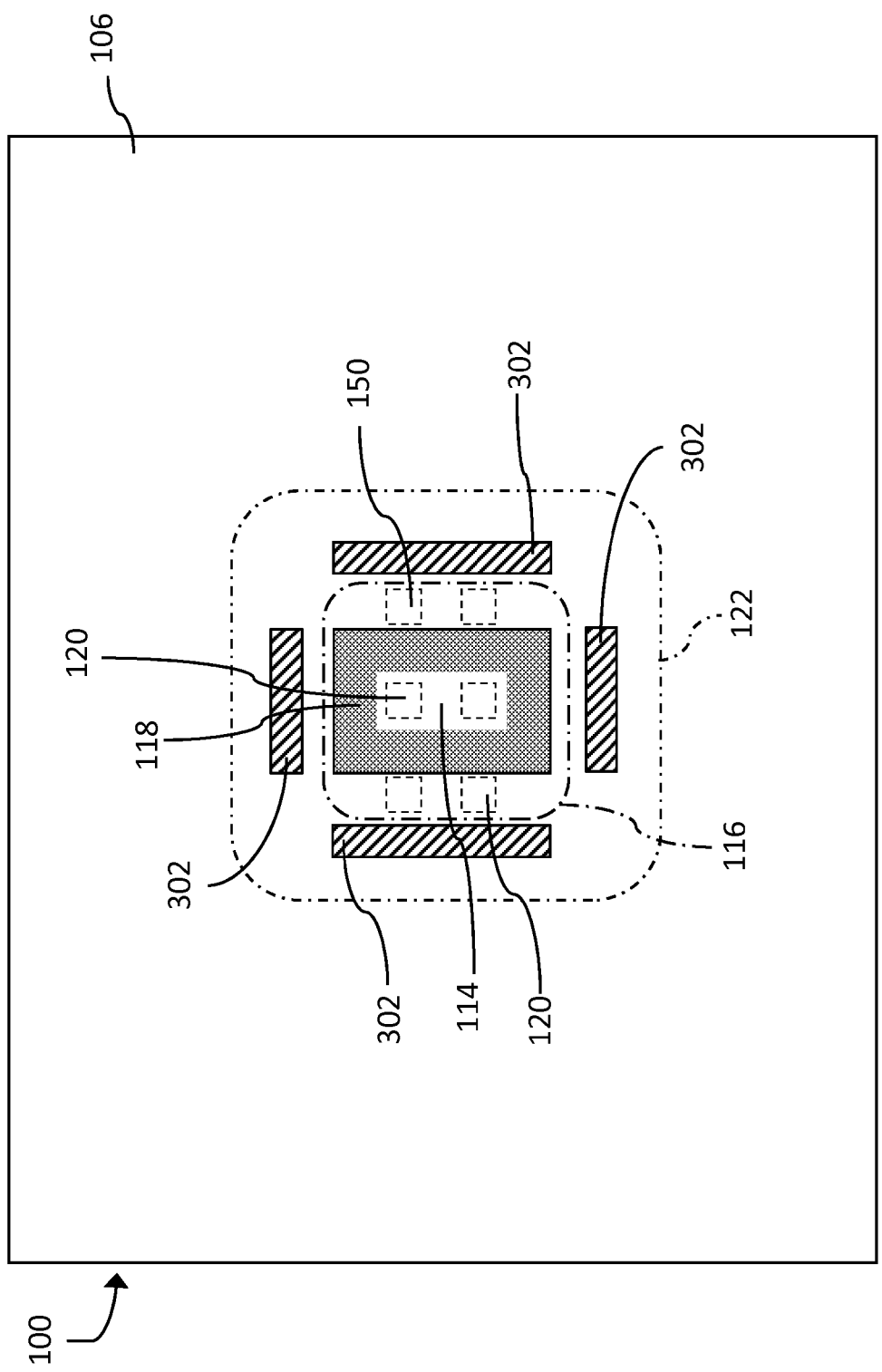
Figure 7:
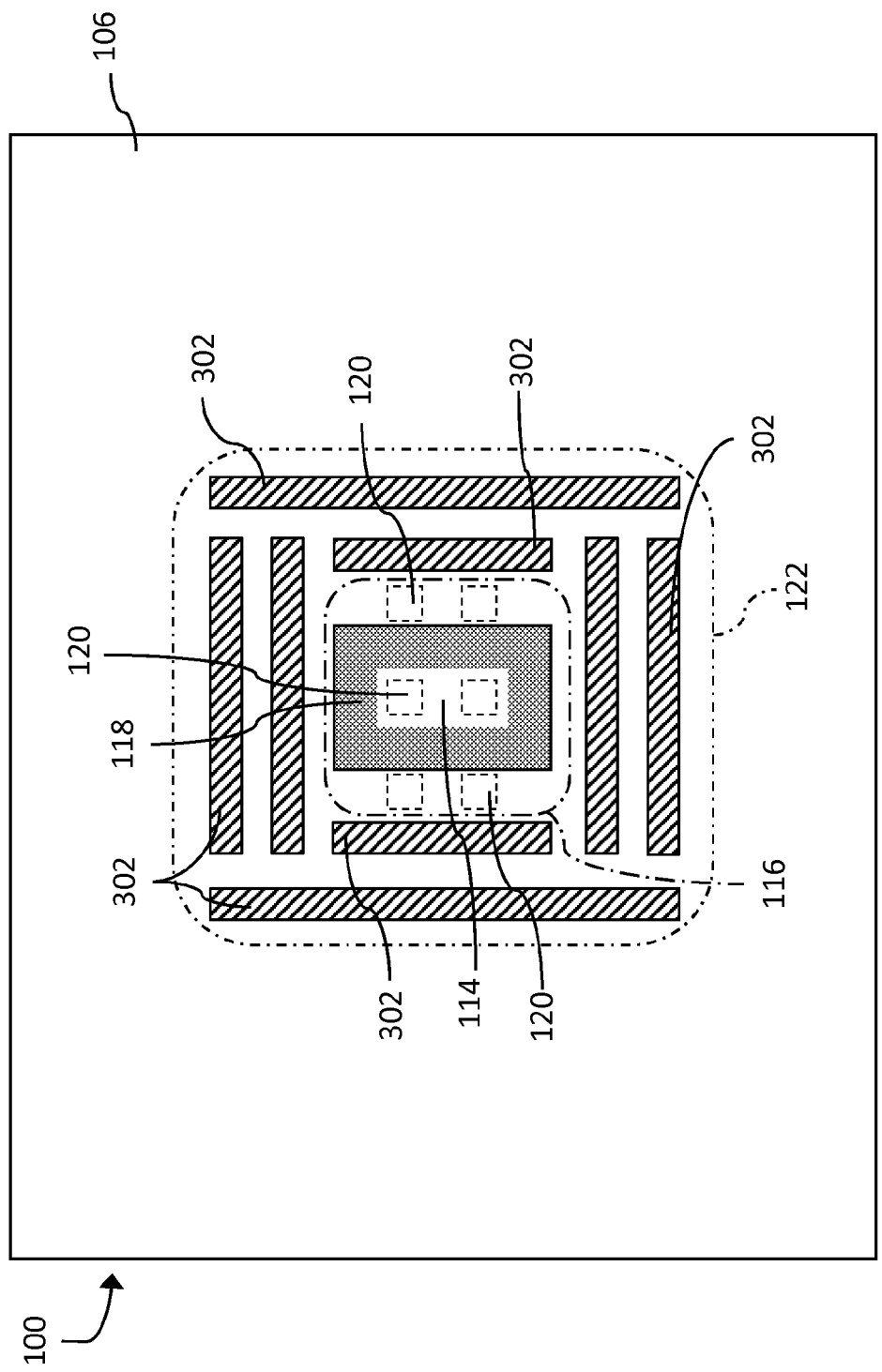
Figure 8:
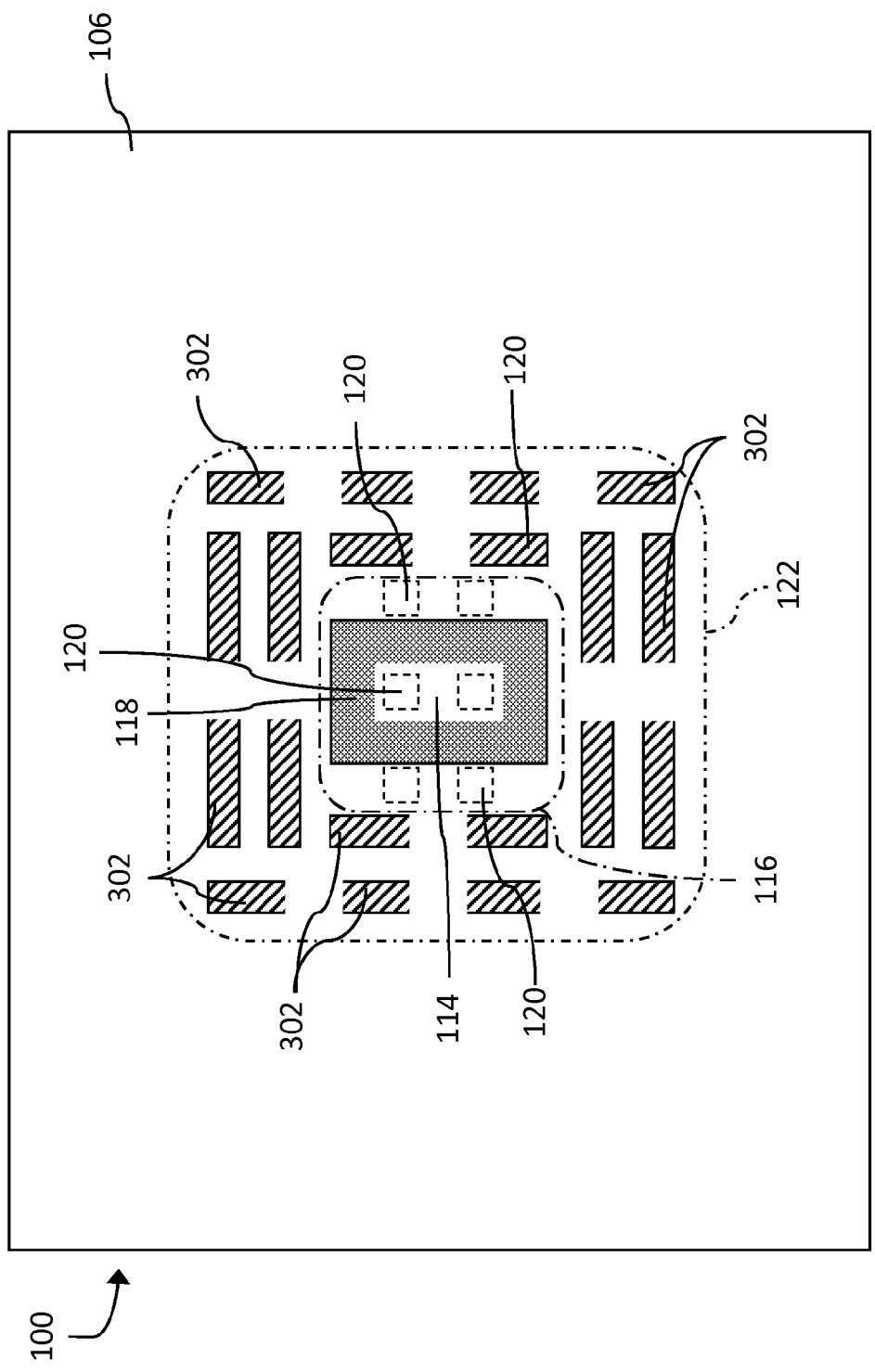
Figure 9:
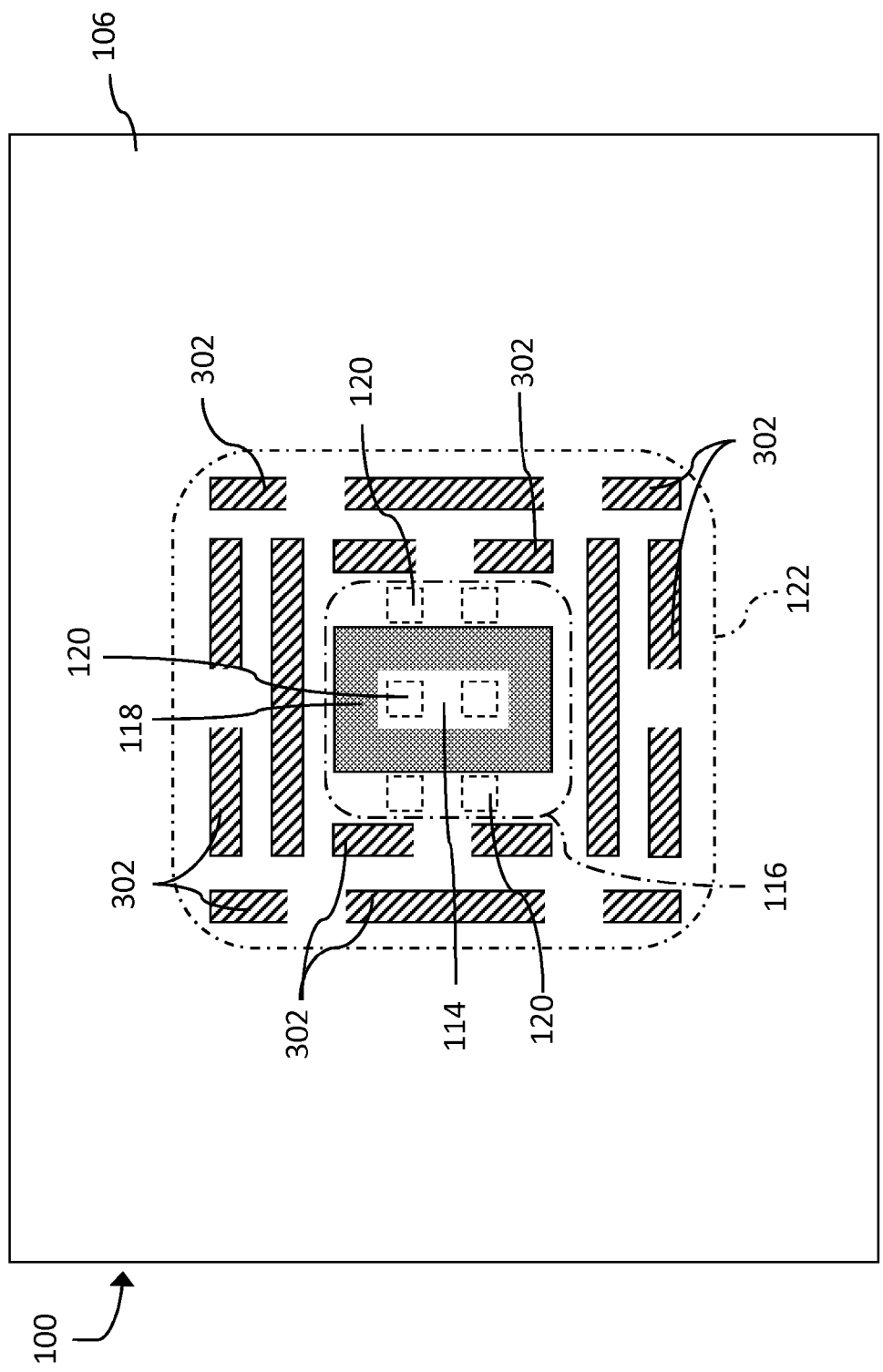

Turning to FIGS. 6-9, opening 302 of semiconductor structure 100 may include a substantially polygonal opening extending through aluminum layer 106. That is, opening 302 may be configured as a substantial polygonal opening through aluminum layer 106 for forming a space within in aluminum layer 106 to allow lateral extrusions 126, 128 (FIGS. 3 and 4) of aluminum layer 106 to form, as discussed herein. Additionally, as shown in FIGS. 6-9, opening 302 includes substantially elongated openings extending through aluminum layer 106. That is, as shown in FIGS. 6-9, opening 302 may include a plurality of discontinuous, substantially elongated openings positioned adjacent substantially ring-shaped opening 118 and the plurality of vias 120. By comparing FIGS. 6-9, it is understood that openings 302 may be formed in a variety of distinct shape, size and positioning within semiconductor structure 100. That is, opening 302 may include just a single set of openings 302 positioned adjacent each side of substantially ring-shaped opening 118 (FIG. 6). Alternatively, opening 302 may include a plurality of openings 302 positioned around each side of substantially ring-shaped opening 118, where each of the plurality of openings on each side are continuous (FIG. 7) or discontinuous (FIG. 9), or in any combination (FIG. 8).

Figure 10:
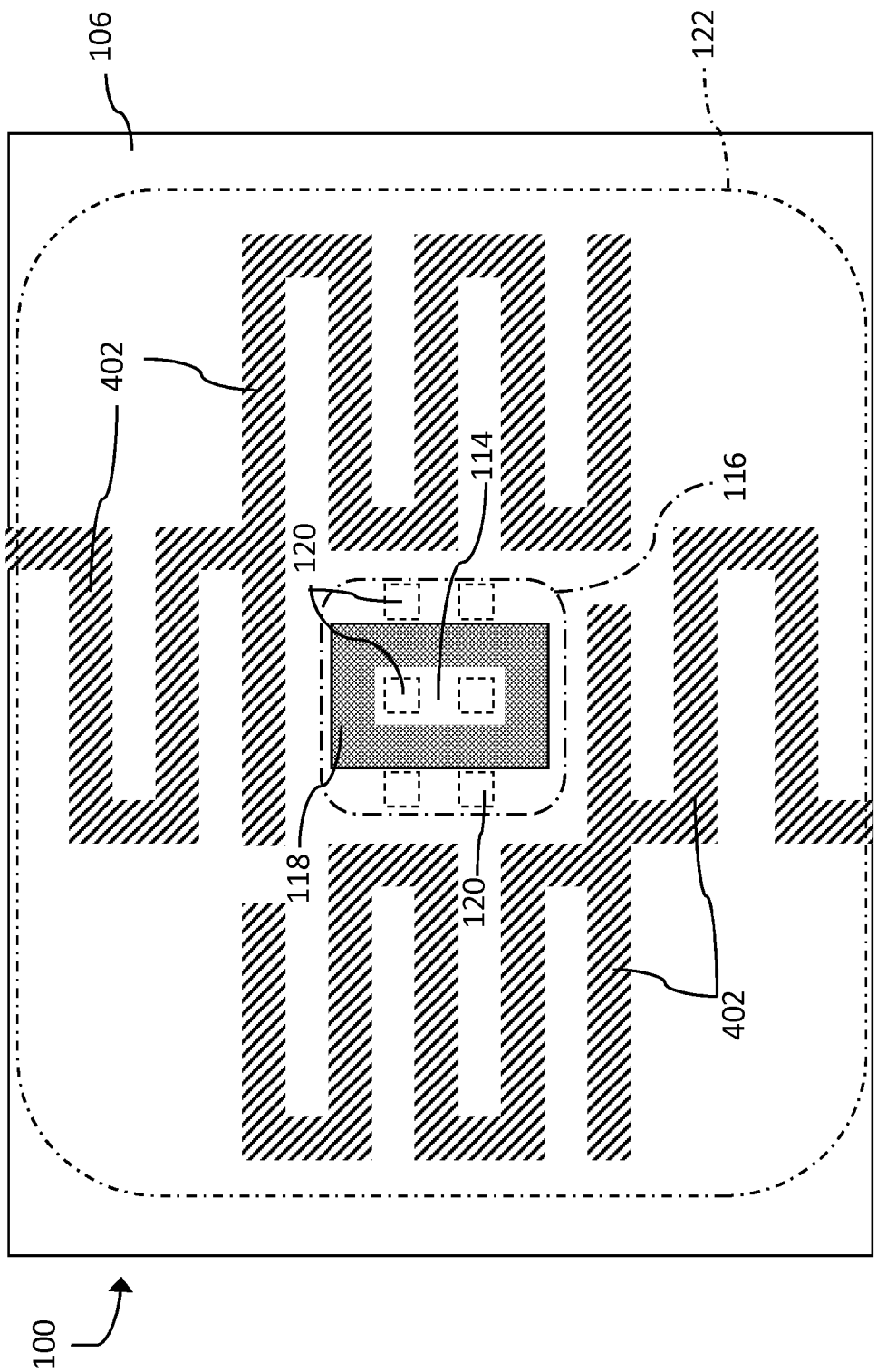

In an additional alternative embodiment, as shown in FIG. 10, opening 102 may include a labyrinth opening 402 formed in aluminum layer 106 of semiconductor structure 100. A shown in FIG. 10, labyrinth opening 402 may be formed in semiconductor structure 100 where aluminum layer 106 may produce a plurality of lateral extrusions 126, 128 (FIGS. 3 and 4) during a metal annealing process of semiconductor structure 100. More specifically, labyrinth opening 402 may be utilized by semiconductor structure 100 when aluminum layer 106 may be exposed to high temperature for an extend period of time and/or may be placed under a high compression force, which may result in a plurality of lateral extrusions 126, 128 (FIGS. 3 and 4) within semiconductor structure 100. By providing labyrinth opening 402, and the respective large space formed in aluminum layer 106 by labyrinth opening 402, semiconductor structure 100 may substantially prevent lateral extrusions 126, 128 (FIGS. 3 and 4) of aluminum layer 106 from undesirably entering active circuit area 116 during the metal annealing process of semiconductor structure 100.

Figure 11:
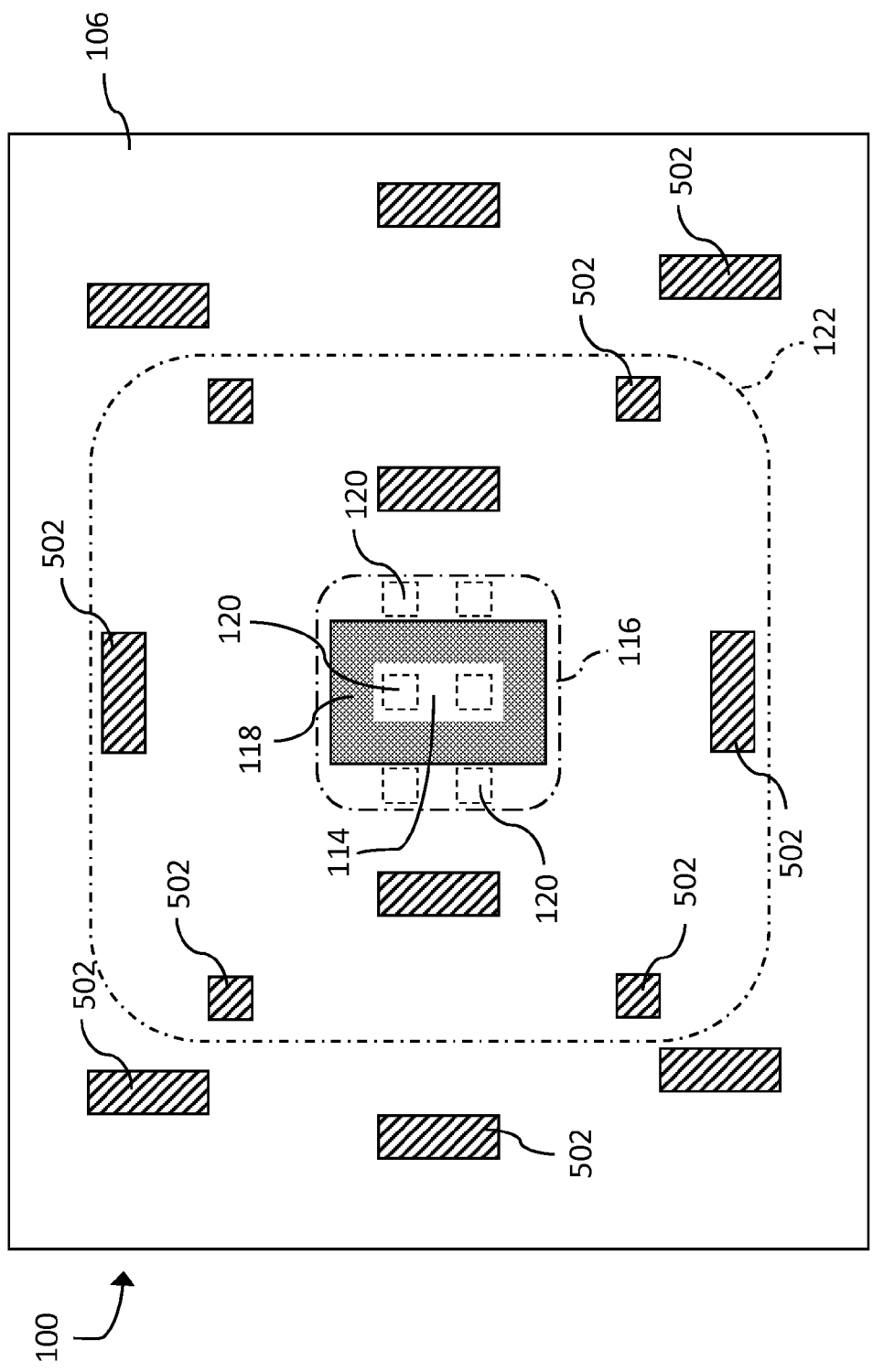
Figure 12:
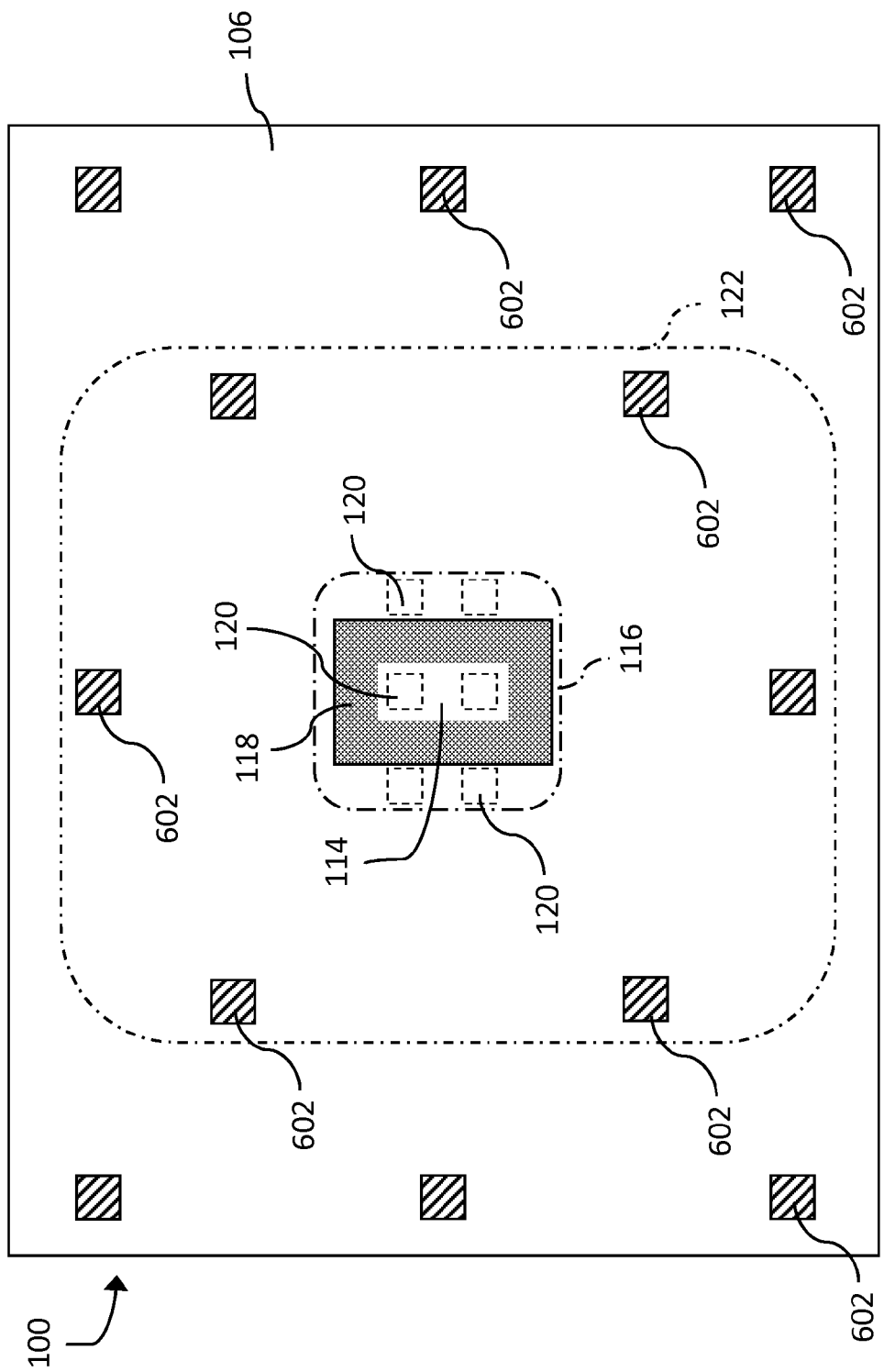

As shown in FIGS. 11 and 12, semiconductor structure 100 may include a plurality of openings 502, 602 disbursed over aluminum layer 106. That is, semiconductor structure 100 may include a plurality of openings 502, 602 extending through aluminum layer 106, where the plurality of openings 502, 602 are positioned throughout aluminum layer 106. As shown in FIG. 11, the plurality of openings 502 may include a variety of distinct polygonal openings (e.g., rectangle, square). Alternatively, as shown in FIG. 12, the plurality of openings 602 may include a single polygonal opening (e.g., square) positioned throughout aluminum layer 106.

Various additional embodiments of the invention may include a method for forming semiconductor structure 100. A method of forming semiconductor structure 100 may now be described. Turning to FIGS. 13-16, one illustrative method according to various embodiments is shown.

Figure 13:
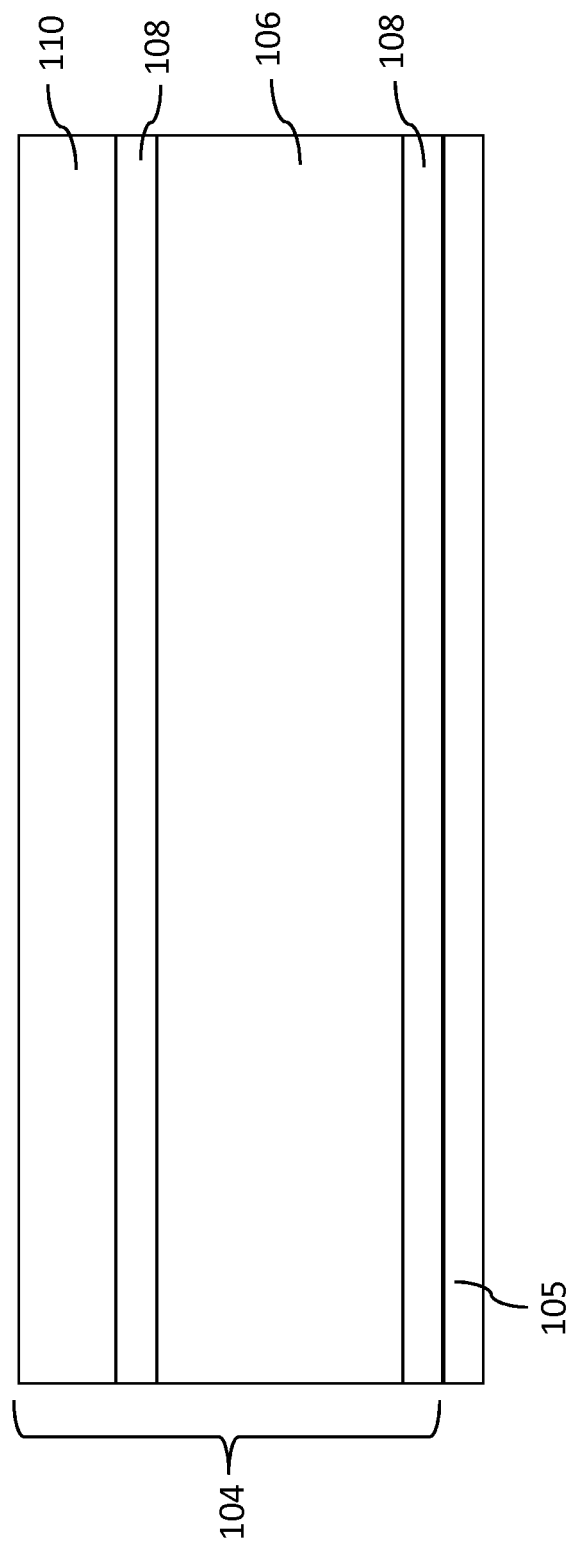
FIGS. 13-16 show cross-sectional views of a semiconductor structure undergoing processes according to various embodiments of the invention.

FIG. 13 depicts a process of forming semiconductor structure 100 according to various embodiments of the invention, the process including forming metallurgy stack 104 over oxide layer 105. More specifically, as shown in FIG. 13, the process may include, in order: forming a first titanium layer 108 over oxide layer 105, forming aluminum layer 106 over the first titanium layer 108, forming a second titanium layer 108 over aluminum layer 106, and finally, forming titanium nitride layer 110 over the second titanium layer 108. As shown in FIG. 13, the layers of metallurgy stack 104 may be formed using any conventional deposition technique described herein and/or known in the art. For example, deposition techniques or the term "depositing" may include any now known or later developed techniques appropriate for the material to be deposited including but not limited to: chemical vapor deposition (CVD), low-pressure CVD (LPCVD), plasma-enhanced CVD (PECVD), semi-atmosphere CVD (SACVD) and high density plasma CVD (HDPCVD), rapid thermal CVD (RTCVD), ultra-high vacuum CVD (UHVCVD), limited reaction processing CVD (LRPCVD), metalorganic CVD (MOCVD), sputtering deposition, ion beam deposition, electron beam deposition, laser assisted deposition, thermal oxidation, thermal nitridation, spin-on methods, physical vapor deposition (PVD), atomic layer deposition (ALD), chemical oxidation, molecular beam epitaxy (MBE), plating, evaporation. Additionally, each layer (e.g., titanium layers 108, aluminum layer 106, etc.) may be planed by any now known or later developed material removal process for providing a contact surface for bonding to an additional layer. For example, material removal processes may include any now known or later developed techniques appropriate for the material to be removed including but not limited to: polishing, reactive ion etching, pattern and etching process, chemical mechanical polish (CMP), etc. Also, each layer (e.g., titanium layers 108, aluminum layer 106, etc.) may be bonded to another respective layer by any now known or later developed bonding technique. For example, bonding techniques may include any now known or later developed technique appropriate for bonding the layers including but not limited to: direct bonding, reactive bonding, adhesive bonding, etc.

Figure 14:
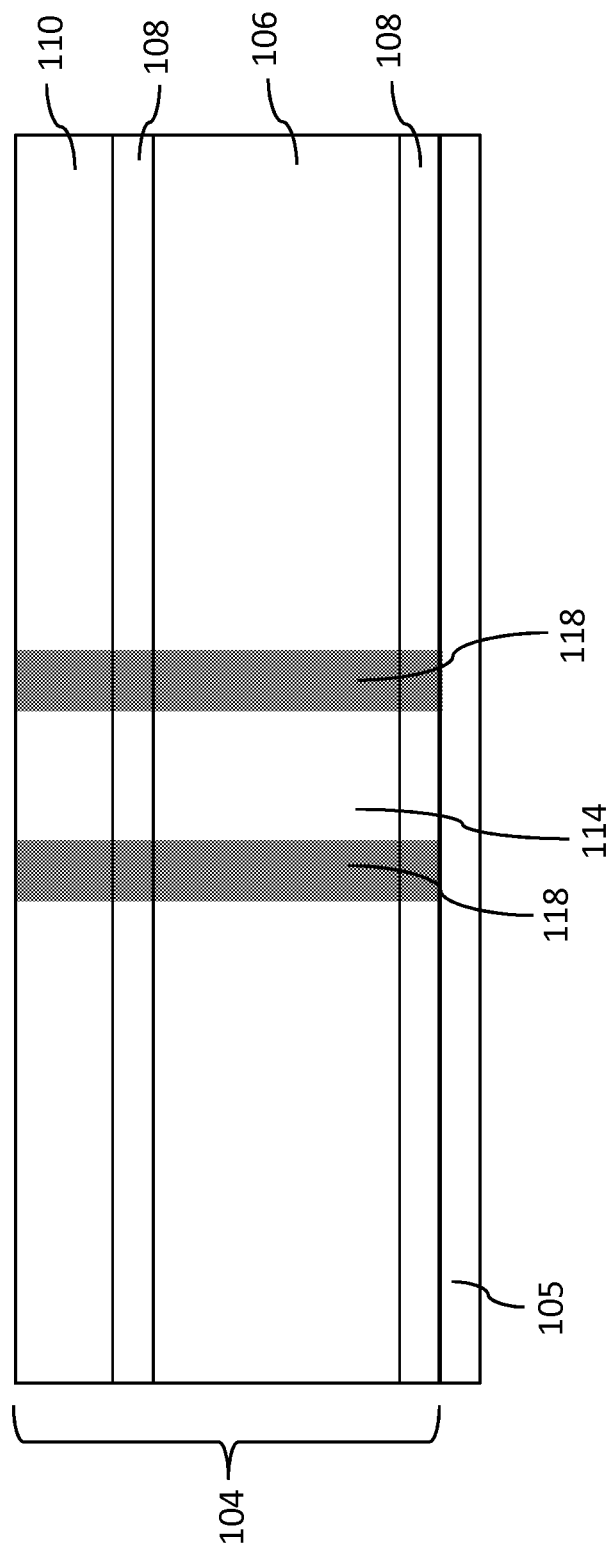

FIG. 14 depicts another process according to various embodiments of the invention, the process including forming substantially ring-shaped opening 118 extending through metallurgy stack 104 including aluminum layer 106. As shown in FIG. 14, substantially ring-shaped opening 118 surrounds aluminum island 114 within aluminum layer 106 (FIG. 2). More specifically, and as discussed herein, substantially ring-shaped opening 118 may be formed around aluminum island 114 within aluminum layer 106 to isolate or separate aluminum island 114 from the remainder of aluminum layer 106 (FIG. 2). Substantially ring-shaped opening 118 may be formed by any now known or later developed material removal process discussed herein, including but not limited to: pattern and etching process, chemical mechanical polish (CMP), photolithographic masking and etching, etc.

Figure 15:
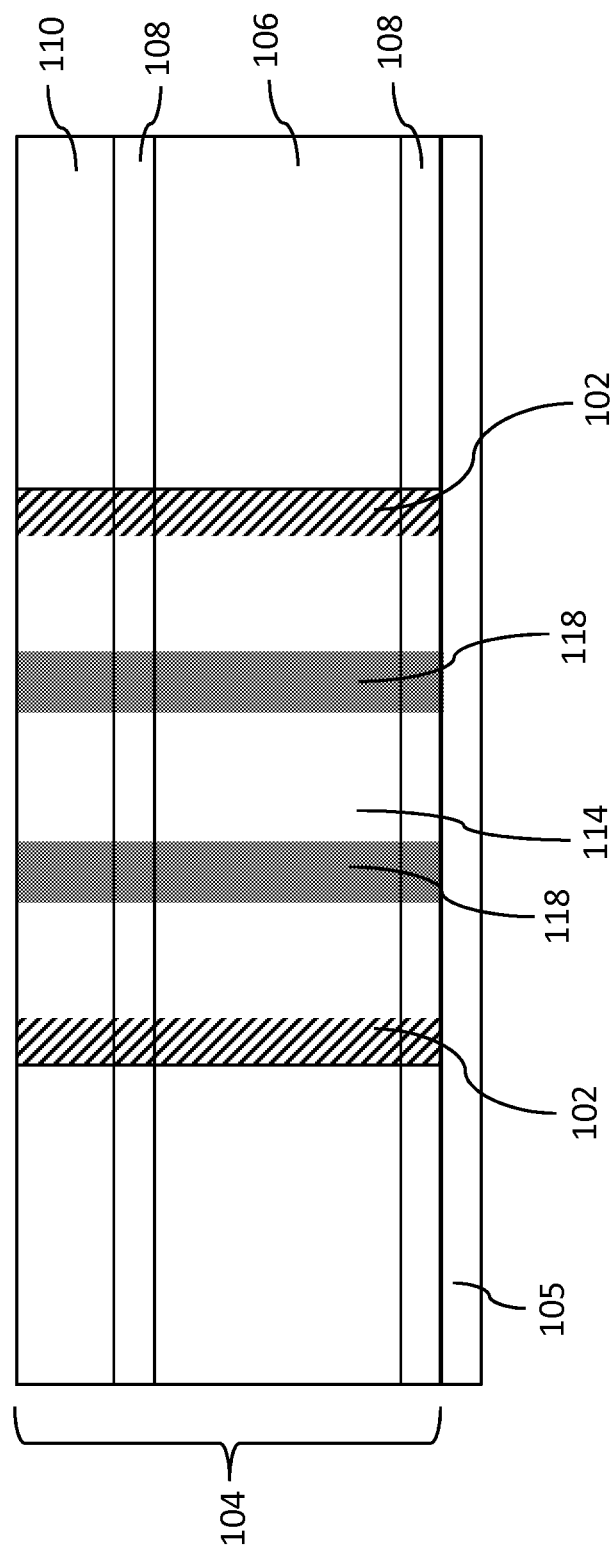

FIG. 15 depicts an additional process according to various embodiments of the invention, the process including forming opening 102 extending through aluminum layer 106 adjacent aluminum island 114 within aluminum layer 106. As shown in FIG. 15 opening 102 may be formed substantially through metallurgy stack 104 and the forming of opening 102 may also include forming opening 102 adjacent substantially ring-shaped opening 118 surrounding aluminum island 114. As discussed herein, and as shown in FIG. 15, forming opening 102 may also include forming a substantially polygonal opening (e.g., opening 102) extending through metallurgy stack 104 including aluminum layer 106. Additionally as discussed herein, forming opening 102 may include forming a substantially elongated opening (e.g., opening 102, FIGS. 6-9). As discussed herein, opening 102 may include lateral extrusion 126, 128 (FIGS. 3 and 4) of aluminum layer 106 after a metal annealing process (e.g., heating of semiconductor structure 100), as discussed herein, is performed on semiconductor structure 100. Opening 102 may be formed by any now known or later developed material removal process discussed herein.

Figure 16:
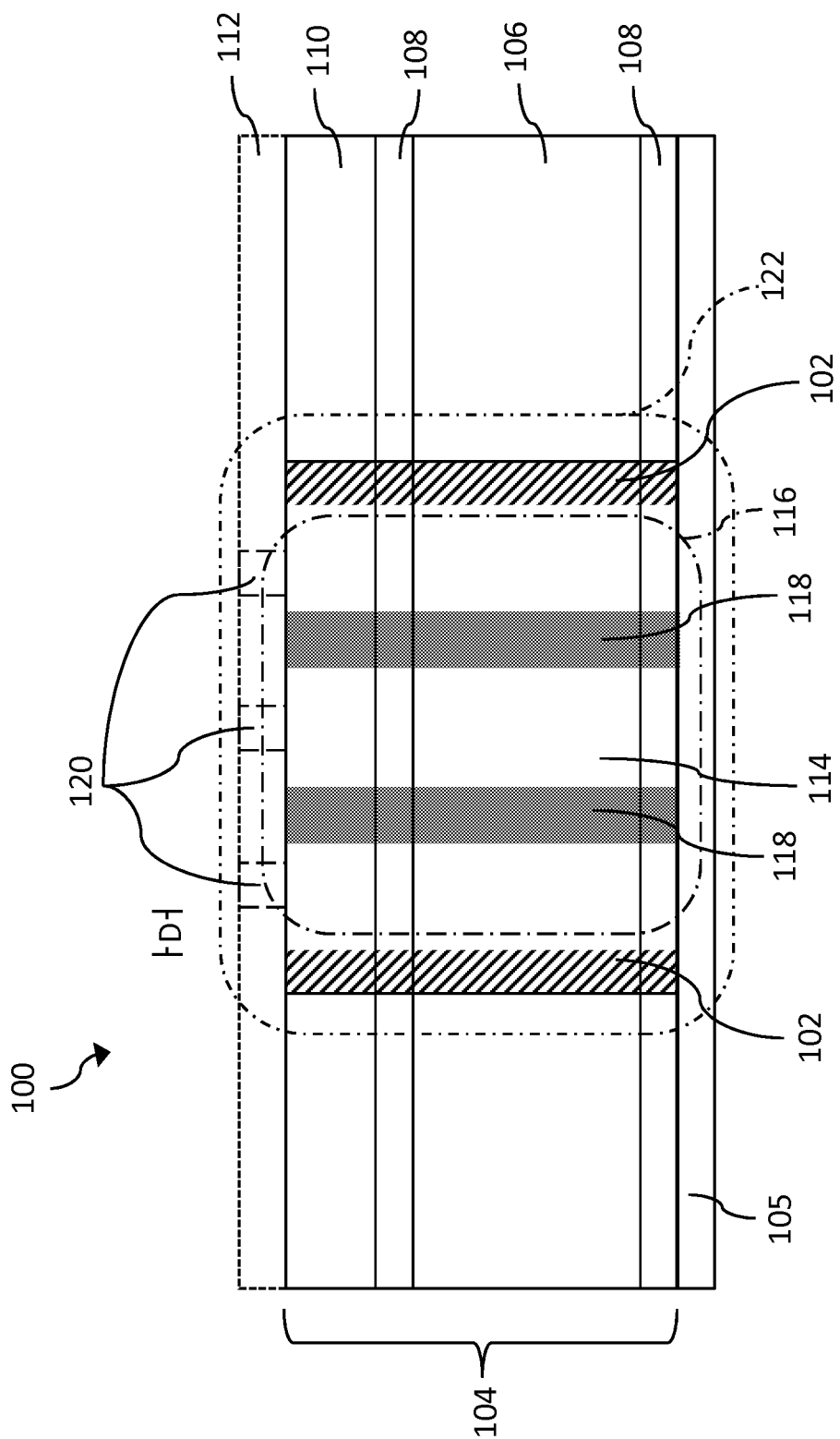

FIG. 16 depicts another process according to various embodiments of the invention, the process including forming silicon nitride layer 112 over metallurgy stack 104. As shown in FIG. 16, the forming of silicon nitride layer 112 over metallurgy stack 104 may include depositing silicon nitride layer 112 over titanium nitride layer 110. The depositing of silicon nitride layer 112 over titanium nitride layer 110 may form a bottom plate for a MIM capacitor (e.g., semiconductor structure 100), as discussed herein. Silicon nitride layer 112 may be formed over titanium nitride layer 110 using any conventional deposition technique described herein and/or known in the art.

FIG. 16 also depicts another process according to various embodiments of the invention, the process including forming the plurality of vias 120 in silicon nitride layer 112. More specifically, as shown in FIG. 16, the process may include forming the plurality of vias 120 in silicon nitride layer 112 to provide a contact above aluminum island 114 within aluminum layer 106, and on either side of aluminum island 114 within aluminum layer 106. In an embodiment, as shown in FIG. 16, the plurality of vias 120 may be formed within active circuit area 116 of semiconductor structure 100. Additionally, as shown in FIG. 16, opening 102 and the plurality of vias 120 may be formed a predetermined distance (D) from one another. As discussed herein, the plurality of vias 120 may provide an electrical connection between the various layers of semiconductor structure 100. The plurality of vias 120 may be formed by any now known or later developed material removal process discussed herein. Additionally, the conductive material (not shown) deposited in the plurality of vias 120 for electrically connecting the layers of semiconductor structure 100 may be deposited within the plurality of vias 120 by any conventional deposition technique described herein and/or known in the art.

In an alternative embodiment, as shown in FIG. 5 and discussed herein, the forming of opening 102 may include forming a portion of opening 102 within substantially ring-shaped opening 118. More specifically, a portion of opening 102 may be formed to extend into the space formed by substantially ring-shaped opening 118, such that opening 102 may provide additional space within substantially ring-shaped opening 118 for receiving lateral extrusions 126, 128 (FIGS. 3 and 4), as discussed herein. Also shown in FIG. 5, and discussed herein, forming opening 102 may further include forming opening 102 between aluminum island 114 within aluminum layer 104 and substantially ring-shaped opening 118.

Although discussed herein as metallurgy stack 104 for MIM capacitor, it is understood that semiconductor structure 100 may include a variety of integrated circuit devices that may utilize opening 102 in a layer to substantially prevent lateral extrusions 126, 128 (FIGS. 3 and 4) during a metal annealing process. More specifically, it is understood that semiconductor structure 100 may be any integrated circuit device that includes metal layers (e.g., aluminum layer 106, titanium layer 108) that may undergo a metal annealing process, and as a result my include lateral extrusions. As such, openings 102 are not limited to metallurgy stack 104 for a MIM capacitor, rather openings 102 may be included in any metal layer of an integrated circuit device that may include lateral extrusions 126, 128 (FIGS. 3 and 4) formed during a metal annealing process of the integrated circuit device.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal languages of the claims.

What is claimed is:

1. A semiconductor structure comprising:
    an aluminum layer including:
        an aluminum island within the aluminum layer for creating an active circuit area of the semiconductor structure; and
        an opening extending through the aluminum layer in a non-active circuit area of the semiconductor structure adjacent the aluminum island, the opening including a lateral extrusion of the aluminum layer of the semiconductor structure.

2. The semiconductor structure of claim 1, further comprising a substantially ring-shaped opening extending through the aluminum layer, the substantially ring-shaped opening surrounding the aluminum island within the aluminum layer.

* * * * *